(12) United States Patent
Chen et al.

(10) Patent No.: US 12,293,784 B2
(45) Date of Patent: May 6, 2025

(54) VOLTAGE CALIBRATION METHOD, MEMORY STORAGE DEVICE AND MEMORY CONTROL CIRCUIT UNIT

(71) Applicant: PHISON ELECTRONICS CORP., Miaoli (TW)

(72) Inventors: Po-Hao Chen, Hsinchu County (TW); Po-Cheng Su, Hsinchu (TW); Shih-Jia Zeng, Hsinchu (TW); Yu-Cheng Hsu, Yilan County (TW); Wei Lin, Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 260 days.

(21) Appl. No.: 18/301,275

(22) Filed: Apr. 17, 2023

(65) Prior Publication Data
US 2024/0304235 A1 Sep. 12, 2024

(30) Foreign Application Priority Data
Mar. 7, 2023 (TW) .................. 112108178

(51) Int. Cl.
*G11C 7/00* (2006.01)
*G06F 3/06* (2006.01)
*G11C 11/409* (2006.01)
*G11C 16/26* (2006.01)

(52) U.S. Cl.
CPC .......... *G11C 11/409* (2013.01); *G06F 3/0679* (2013.01); *G11C 16/26* (2013.01)

(58) Field of Classification Search
CPC ....... G11C 7/1051; G11C 7/22; G11C 7/1072; G11C 7/1006; G11C 7/1066
USPC ......................................... 365/189.14, 189.15
See application file for complete search history.

(56) References Cited

U.S. PATENT DOCUMENTS

| | | | |
|---|---|---|---|
| 11,049,580 B1 | 6/2021 | Gautam et al. | |
| 2016/0372161 A1 | 12/2016 | Chae | |
| 2018/0261292 A1* | 9/2018 | Helm | G11C 16/10 |
| 2021/0255950 A1* | 8/2021 | Tan | G06F 12/0646 |

OTHER PUBLICATIONS

"Office Action of Taiwan Counterpart Application", issued on Feb. 21, 2024, p. 1-p. 8.

* cited by examiner

Primary Examiner — Son T Dinh
(74) Attorney, Agent, or Firm — JCIPRNET

(57) ABSTRACT

A voltage calibration method, a memory storage device, and a memory control circuit unit are disclosed. The method includes: reading first data from a first physical unit using a first read voltage level and reading second data from at least one second physical unit using a second read voltage level; obtaining count information reflecting a total number of memory cells meeting a default condition in the first physical unit and the at least one second physical unit according to the first data and the second data; and calibrating the first read voltage level according to the count information.

33 Claims, 9 Drawing Sheets

VOLTAGE CALIBRATION METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 112108178, filed on Mar. 7, 2023. The entirety of the above-mentioned patent application is hereby incorporated by reference herein and made a part of this specification.

BACKGROUND OF THE INVENTION

Field of the Invention

The invention relates to a memory control technique, and more particularly, to a voltage calibration method, a memory storage device, and a memory control circuit unit.

Description of Related Art

The rapid growth of smart phones, tablet computers, and personal computers in recent years has led to a rapid increase in consumer demand for storage media. Since a rewritable non-volatile memory module (such as a flash memory) has characteristics such as data non-volatility, power-saving, small size, and lack of mechanical structures, the rewritable non-volatile memory module is very suitable to be built into the various portable multimedia devices provided above.

In a memory storage device in which one memory cell may store a plurality of bits, a plurality of default read voltage levels are configured to read data stored in memory cells belonging to different states. However, after the memory storage device is used for a period of time, as the memory cells are worn out, the default read voltage levels may be significantly offset relative to the threshold voltage distribution of the memory cells, even offset to the extent that they may be misjudged as read voltage levels for reading adjacent states. At this time, the use of the conventional read voltage calibration mechanism may not be able to calibrate the read voltage level correctly, thus shortening the service life of the memory storage device.

SUMMARY OF THE INVENTION

The invention provides a voltage calibration method, a memory storage device, and a memory control circuit unit that may improve the calibration efficiency for the read voltage level.

An exemplary embodiment of the invention provides a voltage calibration method configured for a rewritable non-volatile memory module. The rewritable non-volatile memory module includes a plurality of physical units. The voltage calibration method includes: reading first data from a first physical unit in the plurality of physical units using a first read voltage level and reading second data from at least one second physical unit in the plurality of physical units using a second read voltage level; obtaining count information according to the first data and the second data, wherein the count information reflects a total number of memory cells meeting a default condition in the first physical unit and the at least one second physical unit; and calibrating the first read voltage level according to the count information.

An exemplary embodiment of the invention further provides a memory storage device including a connection interface unit, a rewritable non-volatile memory module, and a memory control circuit unit. The connection interface unit is configured to be coupled to a host system. The rewritable non-volatile memory module includes a plurality of physical units. The memory control circuit unit is coupled to the connection interface unit and the rewritable non-volatile memory module. The memory control circuit unit is configured to: issue at least one read command sequence, wherein the at least one read command sequence is configured to instruct to read first data from a first physical unit in the plurality of physical units using a first read voltage level and read second data from at least one second physical unit in the plurality of physical units using a second read voltage level; obtain count information according to the first data and the second data, wherein the count information reflects a total number of memory cells meeting a default condition in the first physical unit and the at least one second physical unit; and calibrate the first read voltage level according to the count information.

An exemplary embodiment of the invention further provides a memory control circuit unit configured to control a rewritable non-volatile memory module. The rewritable non-volatile memory module includes a plurality of physical units. The memory control circuit unit includes a host interface, a memory interface, and a memory management circuit. The host interface is configured to be coupled to a host system. The memory interface is configured to be coupled to the rewritable non-volatile memory module. The memory management circuit is coupled to the memory interface and the memory interface. The memory management circuit is configured to: issue at least one read command sequence, wherein the at least one read command sequence is configured to instruct to read first data from a first physical unit in the plurality of physical units using a first read voltage level and read second data from at least one second physical unit in the plurality of physical units using a second read voltage level; obtain count information according to the first data and the second data, wherein the count information reflects a total number of memory cells meeting a default condition in the first physical unit and the at least one second physical unit; and calibrate the first read voltage level according to the count information.

Based on the above, after the first data is read from the first physical unit using the first read voltage level and the second data is read from the at least one second physical unit using the second read voltage level, the count information may be obtained according to the first data and the second data. In particular, the count information may reflect the total number of memory cells meeting the default condition in the first physical unit and the second physical unit. Thereafter, the first read voltage level may be calibrated according to the count information. Thereby, the calibration efficiency for the read voltage level may be effectively improved.

DESCRIPTION OF THE EMBODIMENTS

In general, a memory storage device (also referred to as a memory storage system) includes a rewritable non-volatile memory module and a controller (also referred to as a control circuit). The memory storage device may be used with a host system, such that the host system may write data into the memory storage device or read data from the memory storage device.

Figure 1:
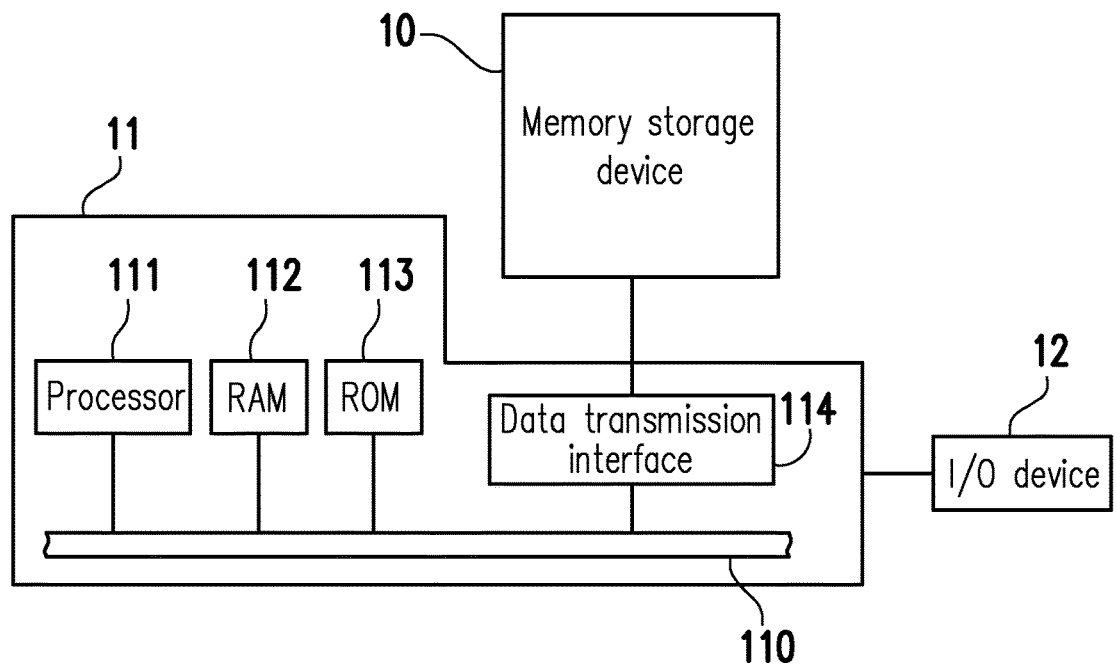
FIG. 1 is a schematic diagram of a host system, a memory storage device, and an input/output (I/O) device shown according to an exemplary embodiment of the invention.
Figure 2:
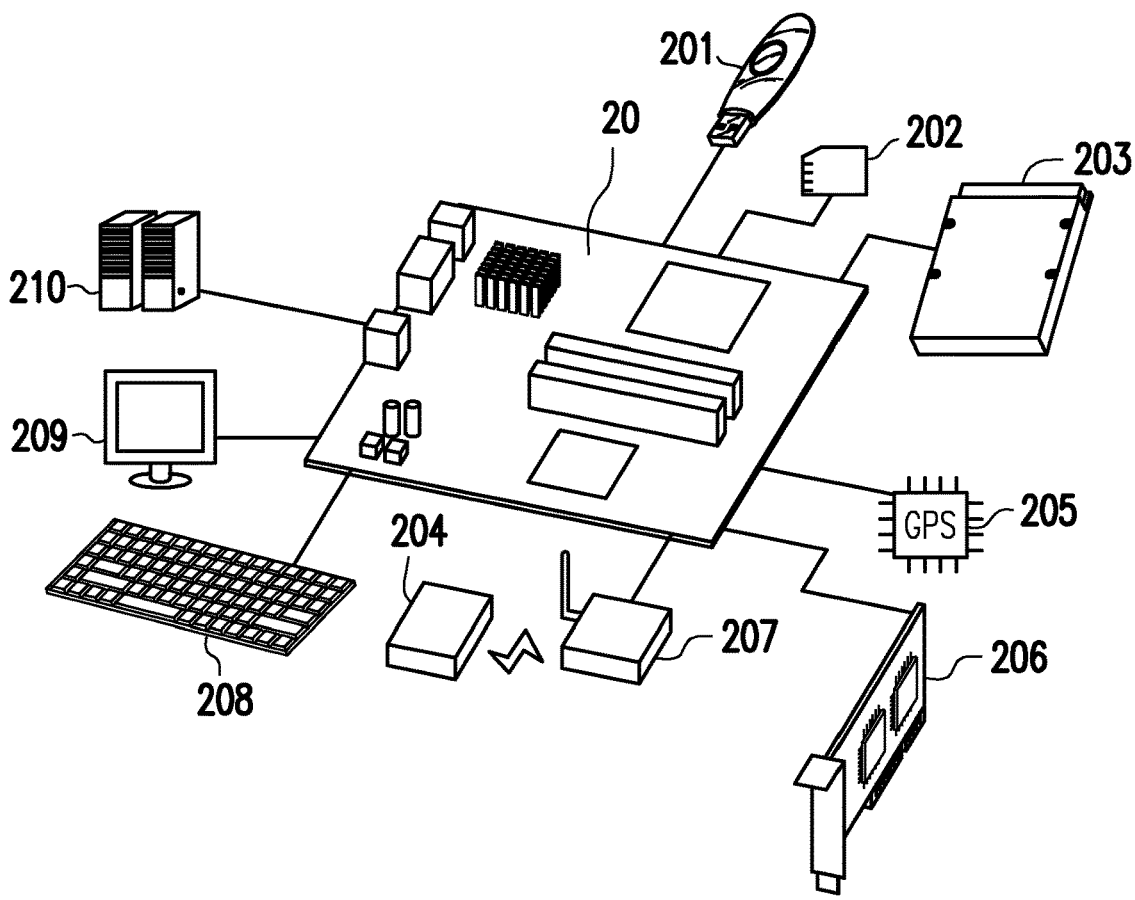
FIG. 2 is a schematic diagram of a host system, a memory storage device, and an I/O device shown according to an exemplary embodiment of the invention.

FIG. 1 is a schematic diagram of a host system, a memory storage device, and an input/output (I/O) device shown according to an exemplary embodiment of the invention. FIG. 2 is a schematic diagram of a host system, a memory storage device, and an I/O device shown according to an exemplary embodiment of the invention.

Referring to FIG. 1 and FIG. 2, a host system 11 may include a processor 111, a random-access memory (RAM) 112, a read-only memory (ROM) 113, and a data transmission interface 114. The processor 111, the RAM 112, the ROM 113, and the data transmission interface 114 may be coupled to a system bus 110.

In an exemplary embodiment, the host system 11 may be coupled to the memory storage device 10 via the data transmission interface 114. For example, the host system 11 may store data into the memory storage device 10 or read data from the memory storage device 10 via the data transmission interface 114. Moreover, the host system 11 may be coupled to the I/O device 12 via the system bus 110. For example, the host system 11 may send an output signal to the I/O device 12 or receive an input signal from the I/O device 12 via the system bus 110.

In an exemplary embodiment, the processor 111, the RAM 112, the ROM 113, and the data transmission interface 114 may be disposed on a motherboard 20 of the host system 11. The quantity of the data transmission interface 114 may be one or a plurality. The motherboard 20 may be coupled to the memory storage device 10 in a wired or wireless method via the data transmission interface 114.

In an exemplary embodiment, the memory storage device 10 may be, for example, a flash drive 201, a memory card 202, a solid-state drive (SSD) 203, or a wireless memory storage device 204. The wireless memory storage device 204 may be, for example, a memory storage device based on various wireless communication techniques such as a near-field communication (NFC) memory storage device, a wireless fax (WiFi) memory storage device, a Bluetooth memory storage device, or a low-power Bluetooth memory storage device (such as iBeacon). Moreover, the motherboard 20 may also be coupled to various I/O devices such as a global positioning system (GPS) module 205, a network interface card 206, a wireless transmission device 207, a keyboard 208, a screen 209, or a speaker 210 via the system bus 110. For example, in an exemplary embodiment, the motherboard 20 may access the wireless memory storage device 204 via the wireless transmission device 207.

In an exemplary embodiment, the host system 11 is a computer system. In an exemplary embodiment, the host system 11 may be any system that may substantially store data with the memory storage device. In an exemplary embodiment, the memory storage device 10 and the host system 11 may respectively include a memory storage device 30 and a host system 31 of FIG. 3.

Figure 3:
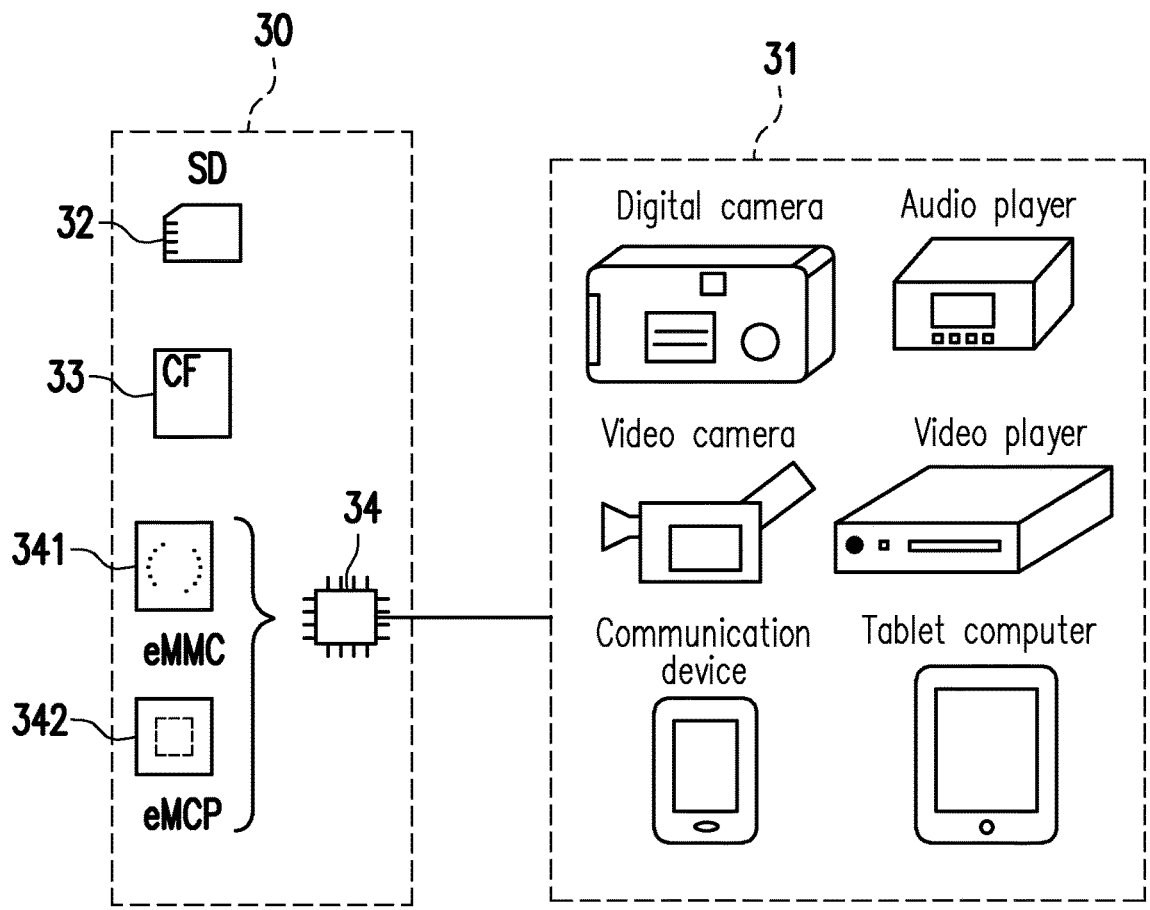
FIG. 3 is a schematic diagram of a host system and a memory storage device shown according to an exemplary embodiment of the invention.

FIG. 3 is a schematic diagram of a host system and a memory storage device shown according to an exemplary embodiment of the disclosure.

Referring to FIG. 3, the memory storage device 30 may be used together with the host system 31 to store data. For example, the host system 31 may be a digital camera, a video camera, a communication device, an audio player, a video player, or a tablet computer. For example, the memory storage device 30 may be various non-volatile memory storage devices such as a secure digital (SD) card 32, a compact flash (CF) card 33, or an embedded storage device 34 used by the host system 31. The embedded storage device 34 includes various types of embedded storage devices that directly couple a memory module to a substrate of the host system such as an embedded multimedia card (eMMC) 341 and/or an embedded multi-chip package (eMCP) storage device 342.

Figure 4:
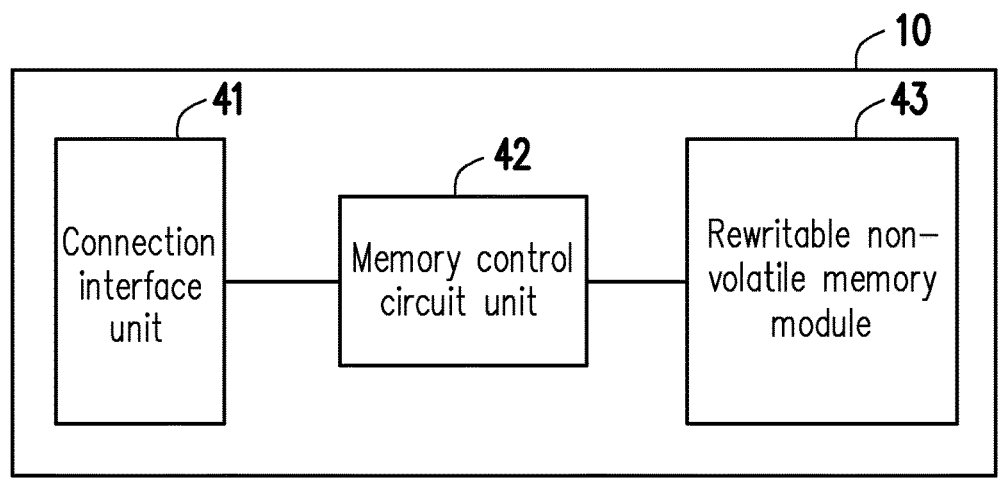
FIG. 4 is a schematic diagram of a memory storage device shown according to an exemplary embodiment of the invention.

FIG. 4 is a schematic diagram of a memory storage device shown according to an exemplary embodiment of the invention.

Referring to FIG. 4, the memory storage device 10 includes a connection interface unit 41, a memory control circuit unit 42, and a rewritable non-volatile memory module 43.

The connection interface unit 41 is configured to couple the memory storage device 10 to the host system 11. The memory storage device 10 may be communicated with the host system 11 via the connection interface unit 41. In an exemplary embodiment, the connection interface unit 41 is compatible with the Peripheral Component Interconnect Express (PCI Express) standard. In an exemplary embodiment, the connection interface unit 41 may also conform to Serial Advanced Technology Attachment (SATA) standard, Parallel Advanced Technology Attachment (PATA) standard, Institute of Electrical and Electronic Engineers (Institute of Electrical and Electronic Engineers, IEEE) 1394 standard, Universal Serial Bus (USB) standard, SD interface standard, Ultra High Speed-I (UHS-I) interface standard, Ultra High Speed-II (UHS-II) interface standard, Memory Stick (MS) interface standard, MCP interface standard, MMC interface standard, eMMC interface standard, Universal Flash Storage (UFS) interface standard, eMCP interface standard, CF interface standard, Integrated Device Electronics (IDE) standard, or other suitable standards. The connection interface unit 41 may be sealed in a chip with the memory control circuit unit 42. Alternatively, the connection interface unit 41 is disposed outside of a chip containing the memory control circuit unit 42.

The memory control circuit unit 42 is coupled to the connection interface unit 41 and the rewritable non-volatile memory module 43. The memory control circuit unit 42 is configured to perform a plurality of logic gates or control commands implemented in a hardware form or in a firmware form. The memory control circuit unit 404 also performs operations such as writing, reading, and erasing data in the rewritable non-volatile memory storage module 43 according to the commands of the host system 11.

The rewritable non-volatile memory module 43 is configured to store the data written by the host system 11. The rewritable non-volatile memory module 43 may include a single-level cell (SLC) NAND-type flash memory module (that is, a flash memory module that may store 1 bit in one memory cell), a multi-level cell (MLC) NAND-type flash memory module (that is, a flash memory module that may store 2 bits in one memory cell), a triple-level cell (TLC) NAND-type flash memory module (i.e., a flash memory module that may store 3 bits in one memory cell), a quad-level cell (QLC) NAND-type flash memory module (that is, a flash memory module that may store 4 bits in one memory cell), other flash memory modules, or other memory modules with the same characteristics.

Each of the memory cells in the rewritable non-volatile memory module 43 stores one or a plurality of bits via the change in voltage (also referred to as threshold voltage hereinafter). Specifically, a charge-trapping layer is disposed between the control gate and the channel of each of the memory cells. By applying a write voltage to the control gate, the number of electrons of the charge-trapping layer may be changed, and therefore the threshold voltage of the memory cells may be changed. This operation of changing the threshold voltage of the memory cells is also referred to as "writing data to the memory cells" or "programming the memory cells". As the threshold voltage is changed, each of the memory cells in the rewritable non-volatile memory module 43 has a plurality of storage states. Which storage state one memory cell belongs to may be determined via the application of a read voltage, so as to obtain one or a plurality of bits stored by the memory cell.

In an exemplary embodiment, the memory cells of the rewritable non-volatile memory module 43 may form a plurality of physical programming units, and the physical programming units may form a plurality of physical erasing units. Specifically, the memory cells on the same word line may form one or a plurality of physical programming units. If one memory cell may store 2 or more bits, the physical programming units on the same word line may be at least classified into lower physical programming units and upper physical programming units. For example, the least significant bit (LSB) of a memory cell belongs to the lower physical programming units, and the most significant bit (MSB) of a memory cell belongs to the upper physical programming units. Generally, in an MLC NAND-type flash memory, the write speed of the lower physical programming units is greater than the write speed of the upper physical programming units, and/or the reliability of the lower physical programming units is greater than the reliability of the upper physical programming units.

In an exemplary embodiment, the physical programming unit is the smallest unit of programming. That is, the physical programming unit is the smallest unit of data writing. For example, the physical programming unit may be a physical page or a physical sector. If the physical programming unit is a physical page, then the physical programming unit may include a data bit area and a redundancy bit area. The data bit area contains a plurality of physical sectors configured to store user data, and the redundancy bit area is configured to store system data (for example, management data such as an error checking code (ECC)). In an exemplary embodiment, the data bit area includes 32 physical sectors, and the size of one physical sector is 512 bytes (B). However, in other exemplary embodiments, the data bit area may also contain 8, 16, or a greater or lesser number of physical sectors, and the size of each of the physical sectors may also be greater or smaller. Moreover, the physical erasing unit is the smallest unit of erasing. That is, each of the physical erasing units contains the smallest number of memory cells erased together. For example, the physical erasing unit is a physical block.

Figure 5:
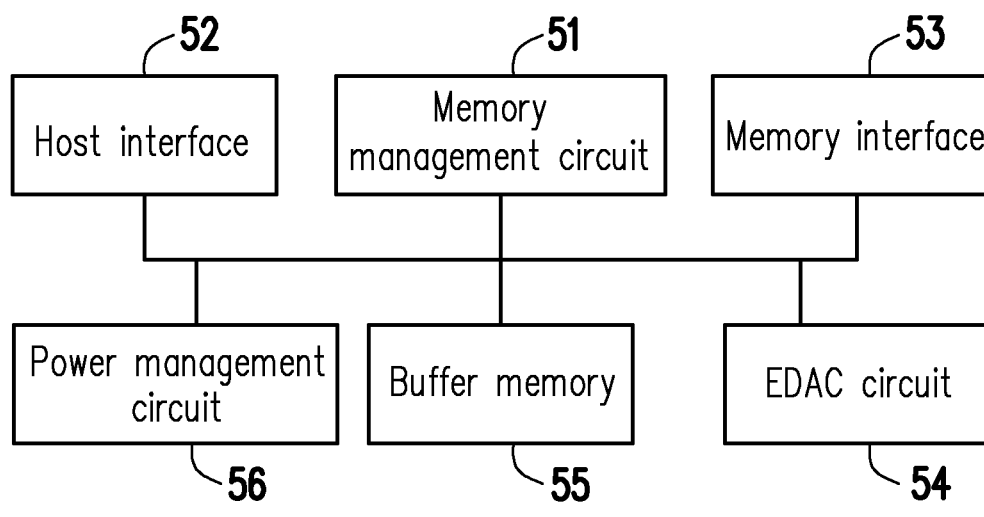
FIG. 5 is a schematic diagram of a memory control circuit unit shown according to an exemplary embodiment of the invention.

FIG. 5 is a schematic diagram of a memory control circuit unit shown according to an exemplary embodiment of the invention.

Referring to FIG. 5, the memory control circuit unit 42 includes a memory management circuit 51, a host interface 52, and a memory interface 53. The memory management circuit 51 is configured to control the overall operation of the memory control circuit unit 42. Specifically, the memory management circuit 51 has a plurality of control commands. During the operation of the memory storage device 10, the control commands are executed to perform operations such as writing, reading, and erasing data. In the following, descriptions relating to the operation of the memory management circuit 51 are equivalent to the descriptions of the operation of the memory control circuit unit 42.

In an exemplary embodiment, the control commands of the memory management circuit 51 are implemented in a firmware form. For example, the memory management circuit 51 has a microprocessor unit (not shown) and a ROM (not shown), and the control commands are burned into the ROM. During the operation of the memory storage device 10, the control commands are executed by the microprocessor unit to perform operations such as writing, reading, and erasing data.

In an exemplary embodiment, the control commands of the memory management circuit 51 may also be stored in a specific area of the rewritable non-volatile memory module 43 (for example, a system area dedicated to storing system data in the memory module) in the form of program codes. In addition, the memory management circuit 51 has a microprocessor unit (not shown), a ROM (not shown), and a RAM (not shown). In particular, this ROM has a boot code, and when the memory control circuit unit 42 is enabled, the microprocessor unit first executes the boot code to load the control commands stored in the rewritable non-volatile memory module 43 into the RAM of the memory management circuit 51. Next, the microprocessor unit runs the control commands to perform operations such as writing, reading, and erasing data.

In an exemplary embodiment, the control commands of the memory management circuit 51 may also be implemented in a hardware form. For example, the memory management circuit 51 includes a microcontroller, a memory cell management circuit, a memory write circuit, a memory read circuit, a memory erase circuit, and a data processing circuit. The memory cell management circuit, the memory write circuit, the memory read circuit, the memory erase circuit, and the data processing circuit are coupled to the microcontroller. The memory cell management circuit is configured to manage memory cells or memory cell groups of the rewritable non-volatile memory module 43. The memory writing circuit is configured to issue a write command sequence to the rewritable non-volatile memory module 43 to write data into the rewritable non-volatile memory module 43. The memory read circuit is configured to issue a read command sequence to the rewritable non-volatile memory module 43 to read data from the rewritable non-volatile memory module 43. The memory erase circuit is configured to issue an erase command sequence to the rewritable non-volatile memory module 43 to erase data from the rewritable non-volatile memory module 43. The data processing circuit is configured to process the data to be written into the rewritable non-volatile memory module 43 and the data read from the rewritable non-volatile memory module 43. The write command sequence, the read command sequence, and the erase command sequence may independently include one or a plurality of program codes or command codes and be configured to instruct the rewritable non-volatile memory module 43 to perform corresponding operations such as writing, reading, and erasing. In an exemplary embodiment, the memory management circuit 51 may also issue other types of command sequences to the rewritable non-volatile memory module 43 to instruct the performance of corresponding operations.

The host interface 52 is coupled to the memory management circuit 51. The memory management circuit 51 may be communicated with the host system 11 via the host interface 52. The host interface 52 may be configured to receive and identify commands and data sent by the host system 11. For example, the commands and data sent by the host system 11 may be sent to the memory management circuit 51 via the host interface 52. In addition, the memory management circuit 51 may send data to the host system 11 via the host interface 52. In the present exemplary embodiment, the host interface 52 is compatible with the PCI Express standard. However, it should be understood that the invention is not limited thereto, and the host interface 52 may also be compatible with the SATA standard, PATA standard, IEEE 1394 standard, USB standard, SD standard, UHS-I standard, UHS-II standard, MS standard, MMC standard, eMMC standard, UFS standard, CF standard, IDE standard, or other suitable standards for data transmission.

The memory interface 53 is coupled to the memory management circuit 51 and configured to access the rewritable non-volatile memory module 43. For example, the memory management circuit 51 may access the rewritable non-volatile memory module 43 via the memory interface 53. That is to say, the data to be written into the rewritable non-volatile memory module 43 is converted into a format acceptable to the rewritable non-volatile memory module 43 via the memory interface 53. Specifically, if the memory management circuit 51 is to access the rewritable non-volatile memory module 43, the memory interface 53 transmits the corresponding command sequence. For example, the command sequence may include a write command sequence instructing data writing, a read command sequence instructing data reading, an erase command sequence instructing data erasing, and corresponding command sequences configured to instruct various memory operations (such as changing read voltage level or performing a garbage collection operation). The command sequences are generated by, for example, the memory management circuit 51 and sent to the rewritable non-volatile memory module 43 via the memory interface 53. The command sequences may include one or a plurality of signals or data on a bus. The signals or data may include command codes or program codes. For example, when reading a command sequence, information such as read identification code or memory address is included.

In an exemplary embodiment, the memory control circuit unit 42 further includes an error detection and correction (EDAC) circuit 54, a buffer memory 55, and a power management circuit 56.

The EDAC circuit 54 is coupled to the memory management circuit 51 and configured to perform an EDAC operation to ensure the correctness of data. Specifically, when the memory management circuit 51 receives a write command from the host system 11, the EDAC circuit 54 generates a corresponding error correcting code (ECC) and/or error detecting code (EDC) for the data corresponding to the write command, and the memory management circuit 51 writes the data corresponding to the write command and the corresponding ECC and/or EDC into the rewritable non-volatile memory module 43. Next, when data is read from the rewritable non-volatile memory module 43, the memory management circuit 51 reads the ECC and/or the EDC corresponding to the data at the same time, and the EDAC circuit 54 performs an EDAC operation on the read data based on the ECC and/or the EDC.

The buffer memory 55 is coupled to the memory management circuit 51 and configured to temporarily store data. The power management circuit 56 is coupled to the memory management circuit 51 and configured to control the power of the memory storage device 10.

In an exemplary embodiment, the rewritable non-volatile memory module 43 of FIG. 4 may include a flash memory module. In an exemplary embodiment, the memory control circuit unit 42 of FIG. 4 may include a flash memory controller. In an exemplary embodiment, the memory management circuit 51 of FIG. 5 may include a flash memory management circuit.

Figure 6:
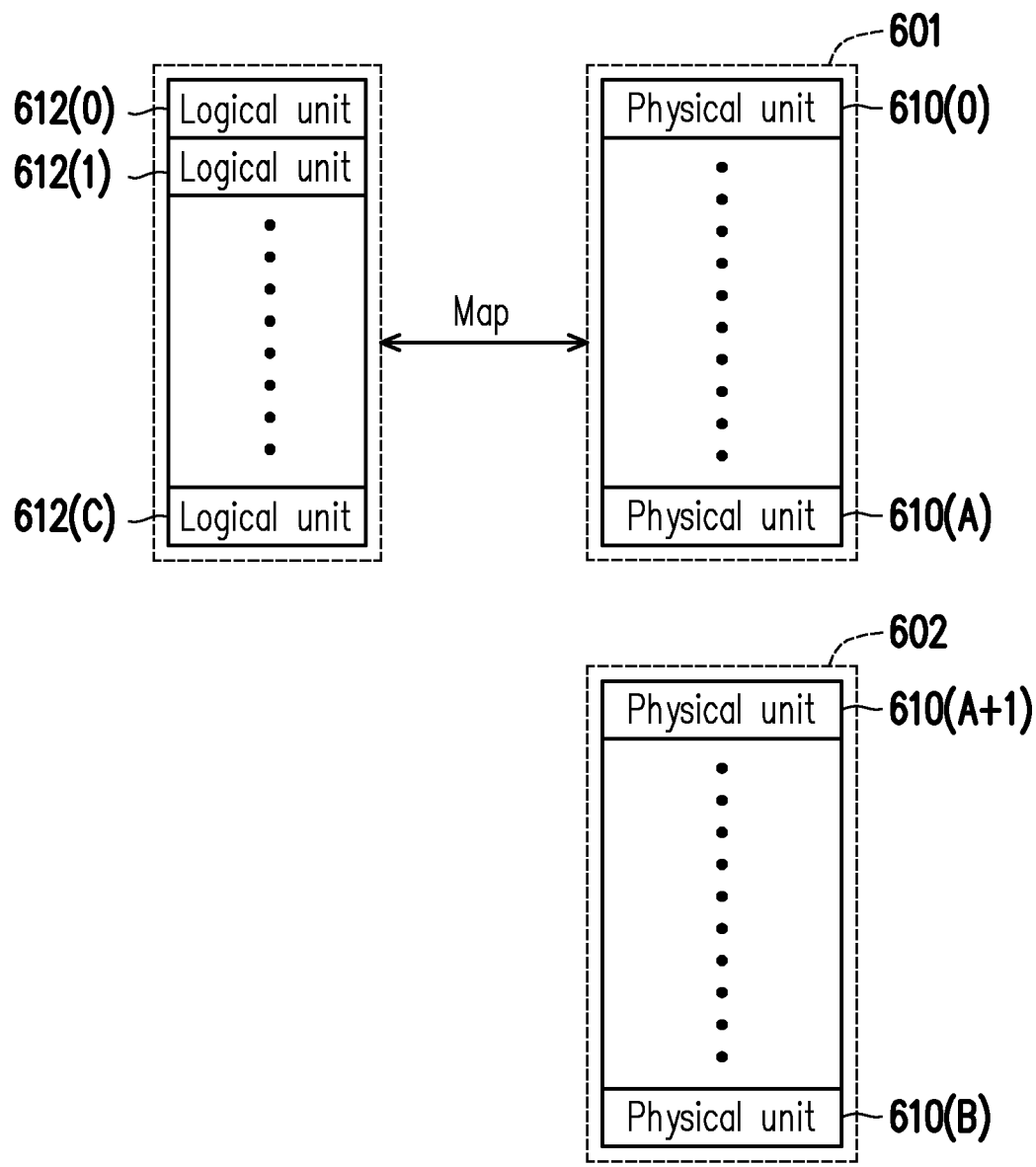
FIG. 6 is a schematic diagram of the management of a rewritable non-volatile memory module shown according to an exemplary embodiment of the invention.

FIG. 6 is a schematic diagram of the management of a rewritable non-volatile memory module shown according to an exemplary embodiment of the invention.

Referring to FIG. 6, the memory management circuit 51 may logically group physical units 610(0) to 610(B) in the rewritable non-volatile memory module 43 into a storage area 601 and a spare area 602. Each of the first physical units may include one or a plurality of physical programming units.

The physical units 610(0) to 610(A) in the storage area 601 are configured to store user data (for example, user data from the host system 11 in FIG. 1). For example, the physical units 610(0) to 610(A) in the storage area 601 may store valid data and/or invalid data. The physical units 610(A+1) to 610(B) in the spare area 602 do not store data (e.g., valid data). For example, if a certain physical unit does not store valid data, then this physical unit may be associated with (or added) to the spare area 602. In addition, the physical units (or physical units that do not store valid data) in the spare area 602 may be erased. When new data is written, one or a plurality of physical units may be extracted from the spare area 602 to store the new data. In an exemplary embodiment, the spare area 602 is also referred to as a free pool.

The memory management circuit 51 may configure logical units 612(0) to 612(C) to map the physical units 610(0) to 610(A) in the storage area 601. In an exemplary embodiment, each of the logical units corresponds to one logical address. For example, one logical address may include one or a plurality of logical block addresses (LBAs) or other logical management units. In an exemplary embodiment, one logical unit may also correspond to one logical programming unit or be formed by a plurality of continuous or discontinuous logical addresses.

It should be noted that one logical unit may be mapped to one or a plurality of physical units. If a certain physical unit is currently mapped by a certain logical unit, the data currently stored in the physical unit includes valid data. On the other hand, if a certain physical unit is currently not mapped by any logical unit, the data currently stored in the physical unit is valid data.

The memory management circuit 51 may record management data describing the mapping relationship between logical units and physical units (also referred to as logical-to-physical mapping information) in at least one logical-to-physical mapping table. When the host system 11 is to read data from the memory storage device 10 or write data to the memory storage device 10, the memory management circuit 51 may access the rewritable non-volatile memory module 43 according to the information in the logical-to-physical mapping table.

In the following exemplary embodiments, an MLC NAND flash memory module is used as the type of the rewritable non-volatile memory module 43 for illustration. However, in another exemplary embodiment, the same or similar operations may also be applied to TLC NAND type, QLC NAND type, or other types of flash memory modules.

In an exemplary embodiment, before certain data (also referred to as raw data) is stored to one or a plurality of physical units (also referred to as first physical units) in the rewritable non-volatile memory module 43, the memory management circuit 51 performs one randomization operation on the raw data to randomize the raw data into another data (also referred to as random data). For example, after the randomization operation, the numbers of bits "0" and "1" in the random data may tend to be consistent (that is, equal or close).

In an exemplary embodiment, the memory management circuit 51 may issue a write command sequence to the rewritable non-volatile memory module 43 to instruct the rewritable non-volatile memory module 43 to program the randomized raw data (namely random data) into a plurality of memory cells in the first physical unit. Accordingly, the programmed memory cells may be attempted to be programmed equally into storage bits "11", "10", "00", and "01".

In an exemplary embodiment, the raw data is from the host system 11 and carries data to be stored in the memory storage device 10. This raw data may be randomized before storage. In an exemplary embodiment, the number of bits of the raw data is the same as the number of bits of the random data.

Figure 7:
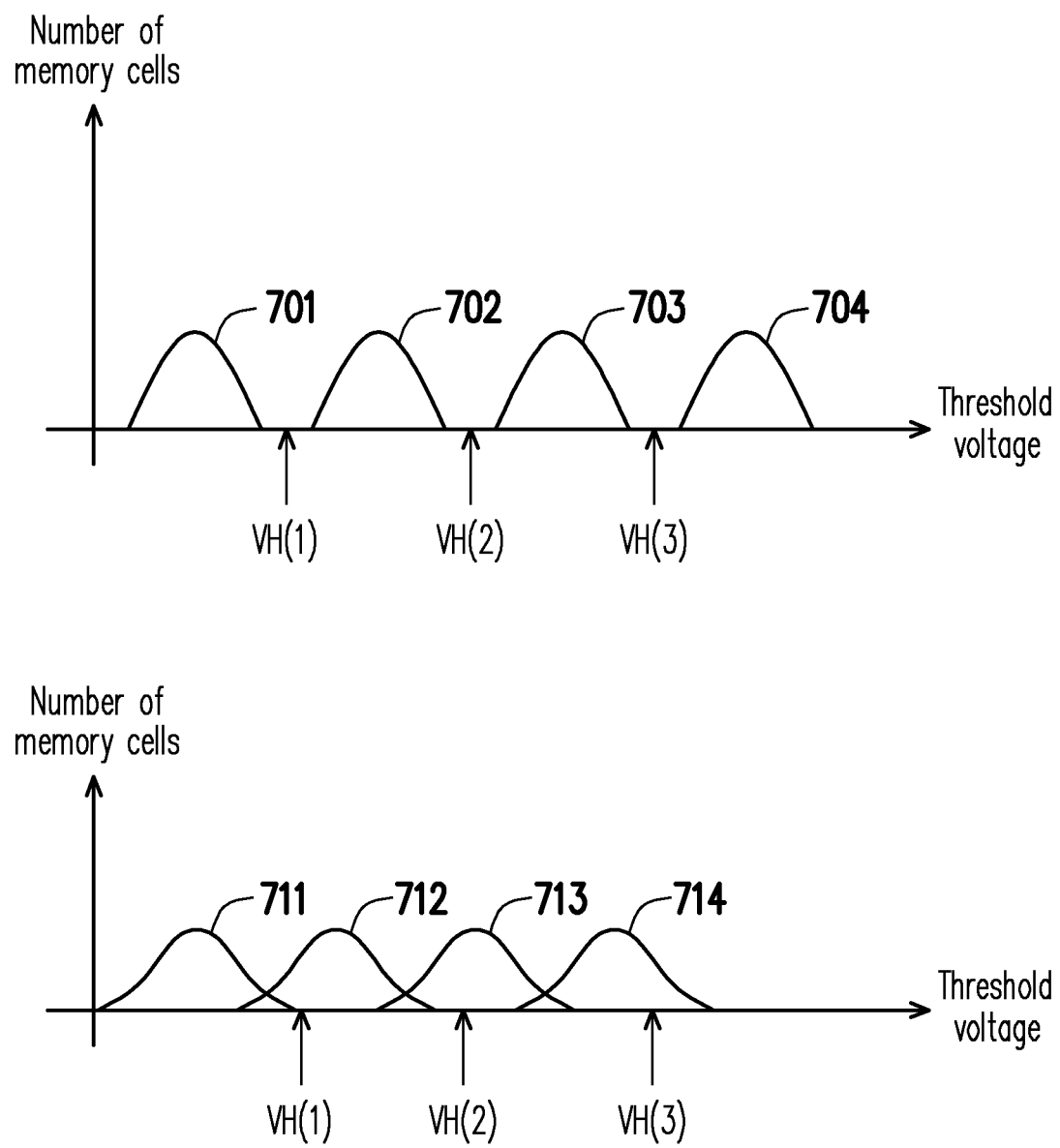
FIG. 7 is a schematic diagram of threshold voltage distribution of memory cells shown according to an exemplary embodiment of the invention.

FIG. 7 is a schematic diagram of threshold voltage distribution of memory cells shown according to an exemplary embodiment of the invention. It should be noted that FIG. 7 shows the threshold voltage distribution of a plurality of programmed memory cells after the memory cells in the first physical unit are programmed according to the random data. Moreover, in FIG. 7, the horizontal axis represents the threshold voltage of the memory cells, and the vertical axis represents the number of memory cells.

Referring to FIG. 7, the programmed memory cells in the first physical unit may have four states 701 to 704. The memory cells belonging to the states 701 to 704 may be configured to store bits "11", "10", "00", and "01" respectively. In other words, the states 701 to 704 correspond to default bit values "11", "10", "00", and "01", respectively. However, in another exemplary embodiment, the number of the states 701 to 704 may be adjusted, and the default bit value corresponding to each of the states may also be adjusted.

In an exemplary embodiment, it is assumed that the programmed plurality of memory cells may be evenly distributed to the states 701 to 704. That is, if the total number of the memory cells is N, and the total number of the states 701 to 704 is M (i.e., 4), then the total number of memory cells belonging to each of the states in the states 701 to 704 is default as N/M (i.e., N/4).

When data is to be read, read voltage levels VH(1) to VH(3) may be applied to the first physical unit to read data stored in at least a portion of the memory cells in the first physical unit. In other words, by sequentially applying the read voltage levels VH(1) to VH(3) to the first physical unit, a certain memory cell in the first physical unit may be determined to belong to one of the states 701 to 704, thus obtaining the data stored in the memory cell. For example, if a certain memory cell may be conducted by the read voltage level VH(2) but not by the read voltage level VH(3), the threshold voltage of the memory cell is between the read voltage levels VH(2) and VH(3). Therefore, it may be determined that the memory cell belongs to the state 703 and is configured to store the bit "00".

However, as the usage time of the first physical unit is increased and/or the operating environment is changed, performance degradation of the memory cells in the first physical unit may occur. After performance degradation occurs, the states 701 to 704 may gradually approach each other or even be overlapped with each other. Additionally, the states 701 to 704 may also become flatter. For example, the states 711 to 714 may be configured to represent the threshold voltage distribution of the memory cells in the first physical unit after performance degradation.

After performance degradation occurs, the read voltage levels VH(1) to VH(3) are significantly offset relative to the states 711 to 714, as shown in FIG. 7. At this time, if the uncalibrated reading voltage levels VH(1) to VH(3) are continuously used to read the memory cells, the states of many memory cells are misjudged, so that there are many errors in the data read from the first physical unit. If the read data contains too many errors, the data may not be successfully decoded and output.

Figure 8:
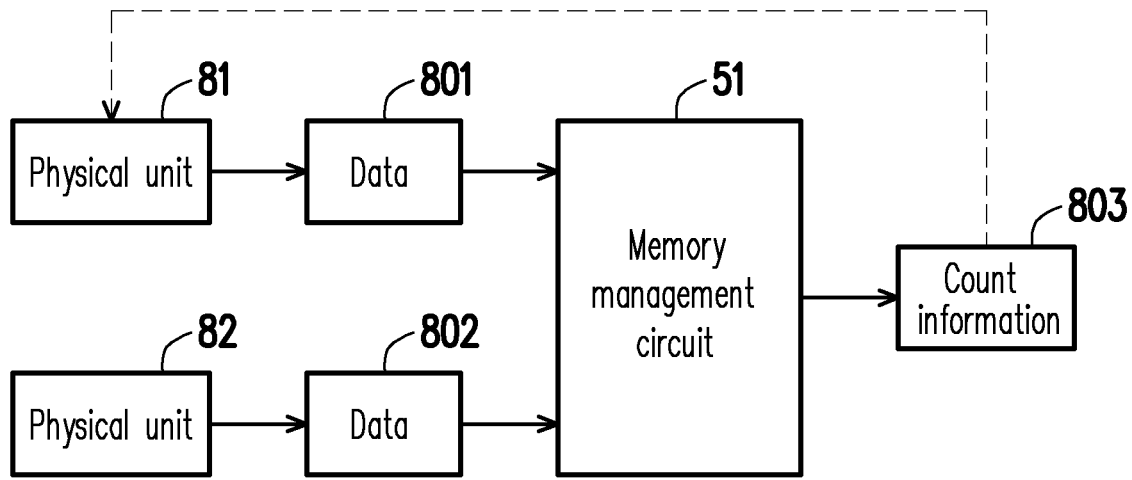
FIG. 8 is a schematic diagram of a calibration operation of a read voltage shown according to an exemplary embodiment of the invention.

FIG. 8 is a schematic diagram of a calibration operation of a read voltage shown according to an exemplary embodiment of the invention.

Referring to FIG. 8, in an exemplary embodiment, the memory management circuit 51 may read data 801 (also referred to as first data) from a physical unit 81 (i.e., first physical unit) using at least one read voltage level and read data 802 (also referred to as second data) from a physical unit 82 (also referred to as second physical unit) using at least one read voltage level. In particular, the read voltage level configured to read the data 801 from the physical unit 81 includes a first read voltage level, and the read voltage level configured to read the data 802 from the physical unit 82 includes a second read voltage level. The voltage value of the first read voltage level may be the same as or different from the voltage value of the second read voltage level. In addition, the physical units 81 and 82 may respectively include at least one physical unit in the physical units 610(0) to 610(A) of FIG. 6. It should be noted that the number of the physical units 82 may be one or a plurality.

After the data 801 and 802 are obtained, the memory management circuit 51 may obtain count information 803 according to the data 801 and 802. The count information 803 may reflect the total number of memory cells in the physical units 81 and 82 meeting the default condition. Then, the memory management circuit 51 may calibrate the first read voltage level according to the count information 803. Or, from another perspective, the memory management circuit 51 may calibrate the first read voltage level according to the total number of memory cells in the physical units 81 and 82 meeting the default condition.

Figure 9:
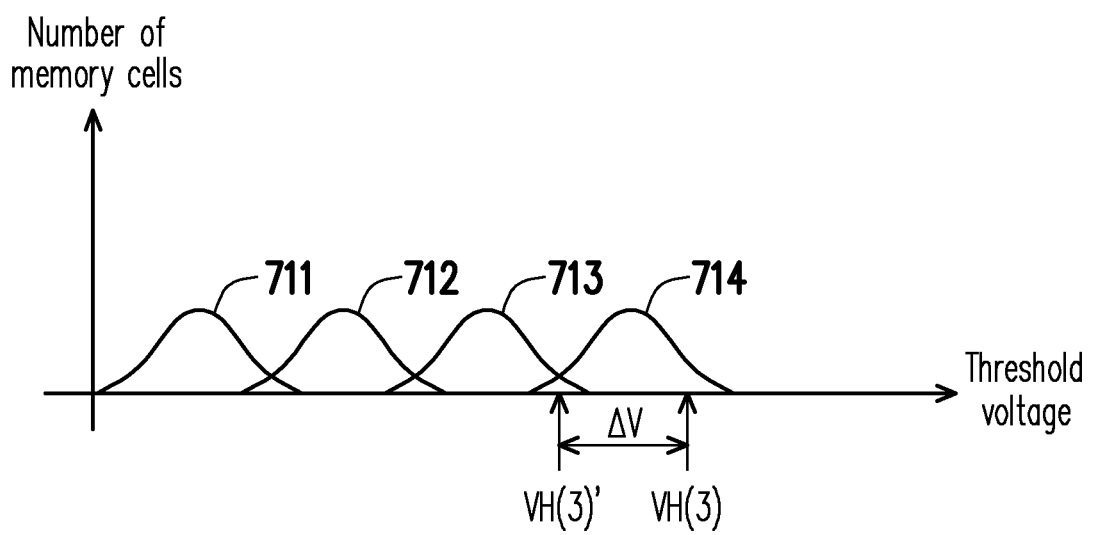
FIG. 9 is a schematic diagram of calibrating a first read voltage level shown according to an exemplary embodiment of the invention.

FIG. 9 is a schematic diagram of calibrating a first read voltage level shown according to an exemplary embodiment of the invention.

Referring to FIG. 8 and FIG. 9, it is assumed that the first read voltage level is the read voltage level VH(3). The memory management circuit 51 may determine one adjustment value ΔV according to the count information 803. For example, the memory management circuit 51 may input the count information 803 into one equation or a lookup table and obtain the adjustment value ΔV according to the output of the equation or the lookup table. Then, the memory management circuit 51 may calibrate the first read voltage level from the read voltage level VH(3) to a read voltage level VH(3)' according to the adjustment value ΔV. The read voltage level VH(3)' is closer to the boundary between the states 713 and 714 than the read voltage level VH(3). Therefore, compared with the read voltage level VH(3), using the read voltage level VH(3)' to re-read data from the physical unit 81 may effectively reduce the total number of error bits in the read data. In addition, the first read voltage level may also be configured to read other read voltage levels of the first physical unit (e.g., the read voltage level VH(1) or VH(2) of FIG. 7).

In an exemplary embodiment, the memory management circuit 51 may obtain one count information (also referred to as first count information) according to the data 801 and obtain another count information (also referred to as second count information) according to the data 802. The first count information may reflect the total number of memory cells (also referred to as first memory cells) in the physical unit 81 meeting the default condition (also referred to as first default condition). For example, the first count information may be obtained by counting the total number of bits "1" (or bits "0") in the data 801. The second count information may reflect the total number of memory cells (also referred to as second memory cells) in the physical unit 82 meeting another default condition (also referred to as second default condition). For example, the second count information may be obtained by counting the total number of bits "1" (or bits "0") in the data 802.

In an exemplary embodiment, the memory management circuit 51 may determine the memory cell for which the numerical relationship between the threshold voltage in the physical unit 81 and the first read voltage level meets a specific condition (also referred to as first condition) as the first memory cell according to the data 801. For example, the first memory cell may include all memory cells in the physical unit 81 having a threshold voltage less than the first read voltage level. In other words, during the process of applying the first read voltage level to the physical unit 81 to read the data 801, the first memory cell may be conducted by the first read voltage level.

In an exemplary embodiment, the memory management circuit 51 may determine the memory cell for which the numerical relationship between the threshold voltage in the physical unit 82 and the second read voltage level meets a specific condition (also referred to as second condition) as the second memory cell according to the data 802. For example, the second memory cell may include all memory cells having a threshold voltage less than the second read voltage level in the physical unit 82. In other words, during the process of applying the second read voltage level to the physical unit 82 to read the data 802, the second memory cell may be conducted by the second read voltage level.

Figure 10:
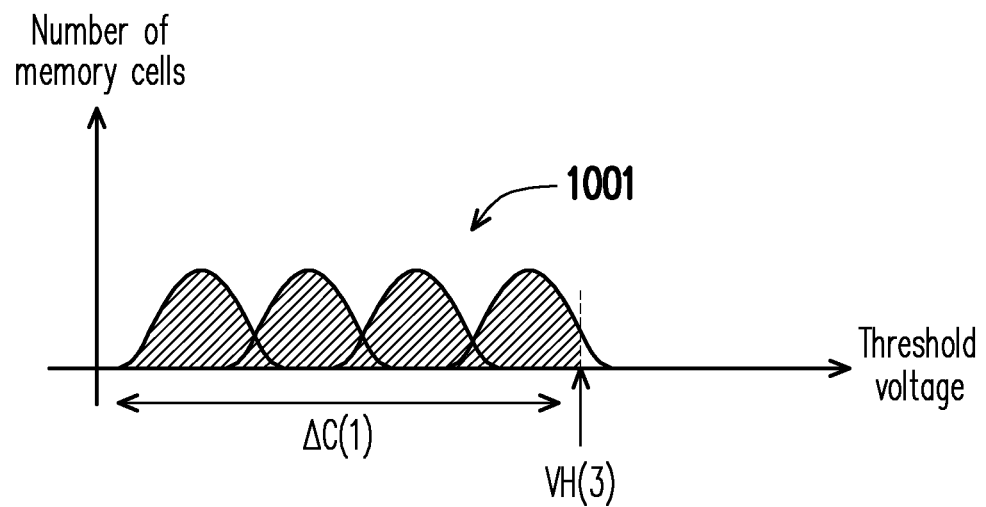
FIG. 10 is a schematic diagram of a first memory cell and a second memory cell shown according to an exemplary embodiment of the invention.
Figure 10:
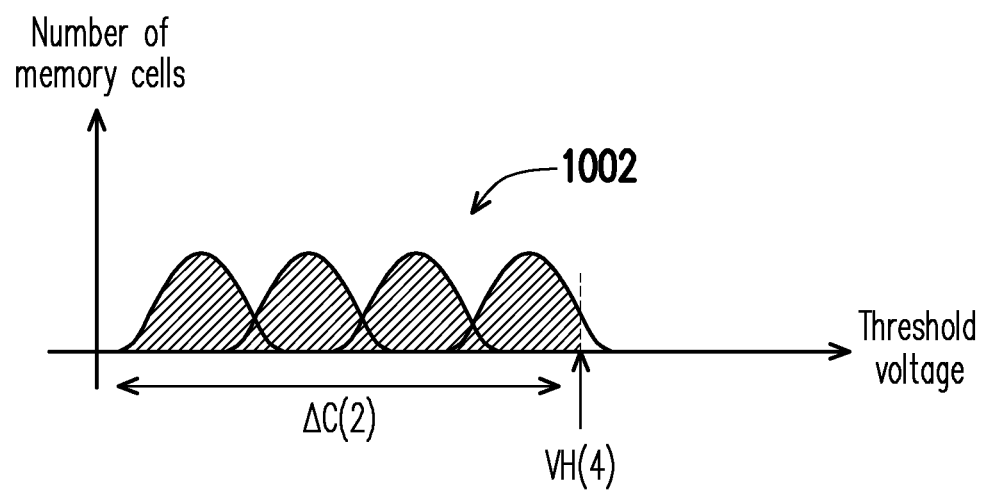

FIG. 10 is a schematic diagram of a first memory cell and a second memory cell shown according to an exemplary embodiment of the invention.

Referring to FIG. 8 and FIG. 10, it is assumed that a distribution 1001 is the threshold voltage distribution (also referred to as first threshold voltage distribution) of a plurality of memory cells in the physical unit 81, and the distribution 1002 is the threshold voltage distribution (also referred to as second threshold voltage distribution) of the plurality of memory cells in the physical unit 82. In addition, it is assumed that the first read voltage level is the read voltage level VH(3), and the second read voltage level is the read voltage level VH(4).

In an exemplary embodiment, the memory management circuit 51 may obtain count information ΔC(1) (i.e., first count information) according to the data 801. The count information ΔC(1) may reflect the total number of memory cells (i.e., first memory cells) having a threshold voltage less than the read voltage level VH(3) in the physical unit 81. For example, the value of the count information ΔC(1) may be positively correlated with the area of the slashed area in the distribution 1001.

In an exemplary embodiment, the memory management circuit 51 may obtain count information ΔC(2) (i.e., second count information) according to the data 802. The count information ΔC(2) may reflect the total number of memory cells (i.e., second memory cells) having a threshold voltage less than the read voltage level VH(4) in the physical unit 82. For example, the value of the count information ΔC(2) may be positively correlated with the area of the slashed area in the distribution 1002.

In an exemplary embodiment, the memory management circuit 51 may obtain the default count information corresponding to the physical unit 81 (also referred to as first default count information) and obtain the default count information (also referred to as second default count information) corresponding to the physical unit 82. The first default count information may reflect the ideal value of the first count information. The second default count information may reflect the ideal value of the second count information. Taking FIG. 10 as an example, the values of the first default count information and the second default count information may both be 3×(N/4), wherein N is the total number of memory cells in one physical unit.

In an exemplary embodiment, the difference between the first count information and the first default count information (also referred to as first difference) may reflect the offset degree of the first read voltage level compared with the threshold voltage distribution (i.e., first threshold voltage distribution) of the plurality of memory cells in the first physical unit. Taking FIG. 10 as an example, the greater the difference (i.e., first difference) between the count information ΔC(1) and the first default count information, the greater the offset degree of the read voltage level VH(3) compared with the first threshold voltage distribution. Similarly, the difference between the second count information and the second default count information (also referred to as second difference) may reflect the offset degree of the second read voltage level compared with the threshold voltage distribution (i.e., second threshold voltage distribution) of the plurality of memory cells in the second physical unit. Taking FIG. 10 as an example, the greater the difference (i.e., second difference) between the count information ΔC(2) and the second default count information, the greater the offset degree of the read voltage level VH(4) compared with the second threshold voltage distribution.

In an exemplary embodiment, the memory management circuit 51 may calibrate the first read voltage level according to the first difference, so as to eliminate or reduce the offset between the first read voltage level and the first threshold voltage distribution. For example, the memory management circuit 51 may determine the adjustment value ΔV in FIG. 9 according to the first difference and calibrate the read voltage level VH(3) according to the adjustment value ΔV. Similarly, the memory management circuit 51 may calibrate the second read voltage level according to the second difference, so as to eliminate or reduce the offset between the second read voltage level and the second threshold voltage distribution.

It should be noted that, in an exemplary embodiment, if the first read voltage level is calibrated solely according to the first count information or the first difference, the calibration efficiency for the first read voltage level may be reduced due to inaccurate first default count information. Taking FIG. 9 as an example, it is assumed that the value of the first default count information is 3×(N/4), but in actuality the number of memory cells belonging to the states 711 to 713 is 3×(N/4)+R, wherein R may be regarded as noise and may be a positive value or a negative value. This noise (i.e., R) may arise from imperfect randomization of the raw data. Affected by the noise (that is, R), the adjustment value ΔV determined according to the first difference may be not accurate enough, thereby reducing the calibration efficiency for the read voltage level VH(3).

In an exemplary embodiment, the memory management circuit 51 may obtain the count information 803 of FIG. 8 according to the sum of the first count information and the second count information. For example, the value of the count information 803 may be equal to or positively related to the sum of the count information ΔC(1) and ΔC(2) of FIG. 10. In addition, the memory management circuit 51 may obtain another default count information (also referred to as third default count information) according to the sum of the first default count information and the second default count information. Taking FIG. 10 as an example, assuming that the values of the first default count information and the second default count information are both 3×(N/4), the value of the third default count information may be 2×3×(N/4).

In an exemplary embodiment, the memory management circuit 51 may obtain the difference between the count information 803 and the third default count information (also referred to as third difference). The memory management circuit 51 may calibrate the first read voltage level according to the third difference. For example, the memory management circuit 51 may determine the adjustment value ΔV in FIG. 9 according to the third difference. For example, the memory management circuit 51 may input the third difference into one equation or a lookup table and obtain the adjustment value ΔV according to the output of the equation or the lookup table. For example, the third difference may be positively related to the adjustment value ΔV. Then, the memory management circuit 51 may calibrate the read voltage level VH(3) according to the adjustment value ΔV.

In other words, in an exemplary embodiment, by enlarging the base of the default count information (for example, the third default count information is equal to the sum of the first default count information and the second default count information), the influence of the noise on the default count information may be reduced. Thereby, the above issues may be alleviated and the calibration efficiency for the first read voltage level may be improved.

In an exemplary embodiment, in order to calibrate the first read voltage level configured to read the physical unit 81, the physical unit 82 needs to meet certain screening conditions. For example, the screening conditions may include that the first physical unit and the second physical unit need to be operated in the same programming environment. If the selected physical unit 82 does not meet the screening conditions, the calibration for the first read voltage level may be out of alignment due to the different programming environment between the first physical unit and the second physical unit.

In an exemplary embodiment, the rewritable non-volatile memory module 43 may include a plurality of planes (also referred to as memory planes). The physical unit 81 may be located at one of the plurality of planes (also referred to as first plane). The physical unit 82 may be located at another of the plurality of planes (also referred to as second plane).

In an exemplary embodiment, the physical units 81 and 82 may belong to the same physical management unit. For example, one physical management unit is also referred to as a super physical programming unit or a super page. The physical management unit may be disposed across the first plane and the second plane. The memory management circuit 51 may access the physical units 81 and 82 via the same or different channels.

Figure 11:
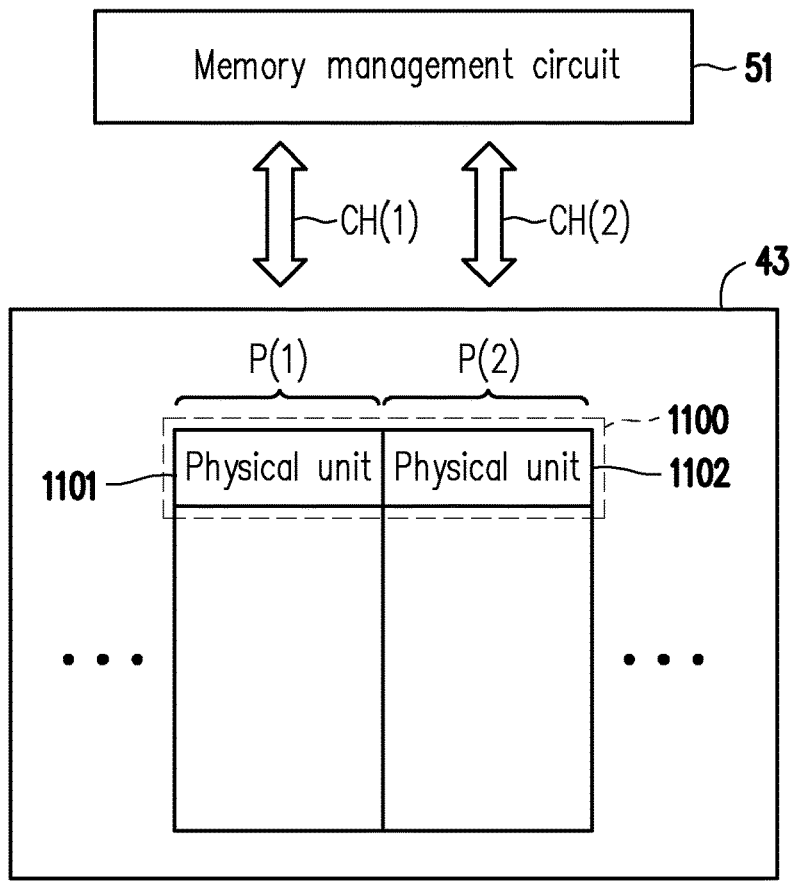
FIG. 11 is a schematic diagram of a rewritable non-volatile memory module including a plurality of planes shown according to an exemplary embodiment of the invention.

FIG. 11 is a schematic diagram of a rewritable non-volatile memory module including a plurality of planes shown according to an exemplary embodiment of the invention.

Referring to FIG. 11, it is assumed that the rewritable non-volatile memory module 43 includes planes P(1) (i.e., first plane) and P(2) (i.e., second plane). The memory management circuit 51 may respectively access the planes P(1) and P(2) via channels CH(1) and CH(2). The plane P(1) contains a plurality of physical units, and the plane P(2) also contains a plurality of physical units. For example, the planes P(1) and P(2) may belong to the same or different dies. Dies are obtained from a wafer via laser cutting.

In an exemplary embodiment, the physical units 81 and 82 of FIG. 8 may include physical units 1101 and 1102 respectively. The physical unit 1101 is located in the plane P(1), and the physical unit 1102 is located in the plane P(2). The physical management unit 1110 includes the physical units 1101 and 1102. In addition, the physical management unit 1110 is disposed across the planes P(1) and P(2).

In an exemplary embodiment, the memory management circuit 51 may issue at least one write command sequence to the rewritable non-volatile memory module 43. The write command sequence may instruct the rewritable non-volatile memory module 43 to perform a programming operation on the physical management unit 1110 to program the physical management unit 1110. For example, the write command sequence may be transmitted to the planes P(1) and P(2) via the channels CH(1) and CH(2) respectively. According to the write command sequence, the physical units 1101 and 1102 in the physical management unit 1110 may be programmed synchronously or continuously. In an exemplary embodiment, the programming operation performed on the physical management unit 1110 is also referred to as a multi-plane writing operation.

After the physical management unit 1110 is programmed, the memory management circuit 51 may issue at least one read command sequence to the rewritable non-volatile memory module 43. The read command sequence may instruct the rewritable non-volatile memory module 43 to perform a read operation on the physical management unit 1110. For example, the read command sequence may be transmitted to the planes P(1) and P(2) via the channels CH(1) and CH(2) respectively. According to the read command sequence, the rewritable non-volatile memory module 43 may read data (namely first data) from the physical unit 1101 using at least one read voltage level including the first read voltage level and read data (i.e., second data) from the physical unit 1102 using at least one read voltage level including the second read voltage level. Then, the memory management circuit 51 may perform the calibration for the first read voltage level according to the first data and the second data. In an exemplary embodiment, the read operation performed on the physical management unit 1110 is also referred to as a multi-plane read operation. In addition, in an exemplary embodiment, the channels CH(1) and CH(2) may also be implemented as a single channel.

It should be mentioned that, although in the exemplary embodiment of FIG. 11, the physical units 1101 (i.e., first physical unit) and 1102 (i.e., second physical unit) are included in the same physical management unit and located on different planes, in another exemplary embodiment, the first physical unit and the second physical unit may also be not included in the same physical management unit and/or the first physical unit and the second physical unit may be located on the same plane, as long as the first physical unit and the second physical unit are operated in the same programming environment.

In an exemplary embodiment, the first physical unit and the second physical unit are operated in the same programming environment may refer to the first physical unit and the second physical unit belong to the same type of physical programming unit, the first physical unit and the second physical unit are included in the same physical management unit, and/or the time points at which the first physical unit and the second physical unit are programmed are at least partially overlapped or adjacent to each other. The first physical unit and the second physical unit belonging to the same type of physical programming unit may refer to both the first physical unit and the second physical unit belong to the upper physical programming unit (for example, upper page), a middle physical programming unit (e.g., middle page), or a lower physical programming unit (e.g., lower page). For different types of flash memory modules, the physical programming unit may also have other types, which are not limited by the invention. The time points at which the first physical unit and the second physical unit are programmed are at least partially overlapped or are adjacent to each other may refer to the time difference between the time point at which the first physical unit is programmed and the time point at which the second physical unit is programmed is less than the default value or the first physical unit and the second physical unit are programmed in parallel or continuously.

In an exemplary embodiment, the memory management circuit 51 may also issue a read command (such as a single-page read command) for the first physical unit and the second physical unit respectively to the rewritable non-volatile memory module 43 to read the first data and the second data respectively from the first physical unit and the second physical unit.

In an exemplary embodiment, on the premise that the first physical unit and the second physical unit are operated in the same programming environment, in the read operation of reading the first data and the second data from the first physical unit and the second physical unit respectively, the read time points of the first physical unit and the second physical unit are also at least partially overlapped or adjacent to each other. For example, the time points at which the first physical unit and the second physical unit are read are at least partially overlapped or are adjacent to each other may refer to the time difference between the time point at which the first physical unit is read and the time point at which the second physical unit is read is less than the default value or the first physical unit and the second physical unit are read in parallel or continuously.

In an exemplary embodiment, after the first data is obtained, the memory management circuit 51 may instruct the EDAC circuit 54 to perform a decoding operation (also referred to as a hard decoding operation) on the first data in an attempt to correct errors in the first data. If the hard decoding operation for the first data is successful (indicating that all errors in the first data are corrected), the memory management circuit 51 may output the successfully decoded first data. For example, the memory management circuit 51 may respond to a read command from the host system 11 to read the first data and return the successfully decoded first data to the host system 11. In addition, if the hard decoding operation for the first data fails, the memory management circuit 51 may initiate the read voltage calibration for the first read voltage level. For example, in the read voltage calibration, the memory management circuit 51 may obtain count information according to the first data and the second data and calibrate the first read voltage level according to the count information. Relevant operation details are described in detail above, and are not repeated herein.

In an exemplary embodiment, if a certain decoding in the hard decoding operation may not correct all errors in the first data (that is, the decoding fails), the memory management circuit 51 may update one retry count (for example, add one to the retry count) and determine whether the retry count reaches a default value. If the retry count does not reach the default value, the memory management circuit 51 may query the retry table to change the read voltage level (including the first read voltage level) configured to read the first physical unit. Next, the memory management circuit 51 may re-read the data of the first physical unit using the changed read voltage level until the read data (namely first data) may be successfully decoded or the retry count reaches a default value. In an exemplary embodiment, if the retry count reaches the default value, the memory management circuit 51 may determine that the hard decoding operation for the first data fails and initiates the read voltage calibration corresponding to the first physical unit.

In an exemplary embodiment, the second data read from the second physical unit is not used in the hard decoding operation for the first data. In an exemplary embodiment, if the second data is read from the second physical unit before the first data is decoded or during the decoding of the first data, the memory management circuit 51 may temporarily store the second data in the buffer memory 55 and not apply the second data to the hard decoding operation of the first data. In an exemplary embodiment, the memory management circuit 51 does not apply the second data to the read voltage calibration for the first physical unit until it is determined that the hard decoding operation for the first data fails and/or the read voltage calibration corresponding to the first physical unit is initiated. Relevant operation details are described in detail above, and are not repeated herein.

Figure 12:
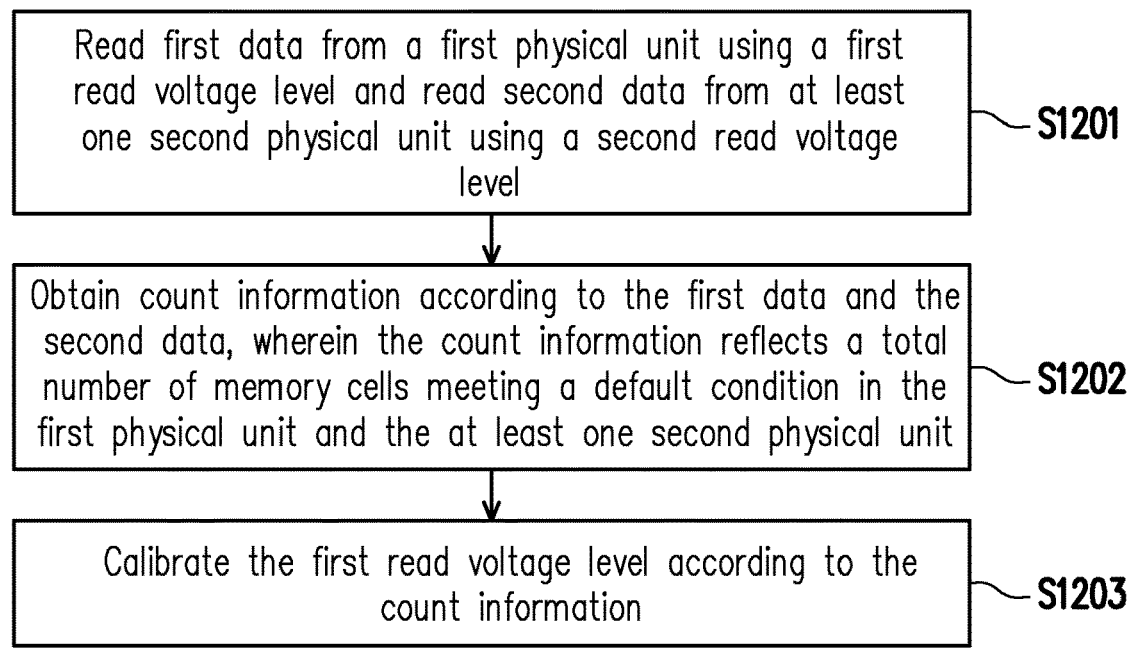
FIG. 12 is a flowchart of a voltage calibration method shown according to an exemplary embodiment of the invention.

FIG. 12 is a flowchart of a voltage calibration method shown according to an exemplary embodiment of the invention.

Please refer to FIG. 12, in step S1201, first data is read from a first physical unit using a first read voltage level and second data is read from at least one second physical unit using a second read voltage level. In step S1202, count information is obtained according to the first data and the second data, wherein the count information reflects the total number of memory cells meeting a default condition in the first physical unit and the at least one second physical unit. In step S1203, the first read voltage level is calibrated according to the count information.

Figure 13:
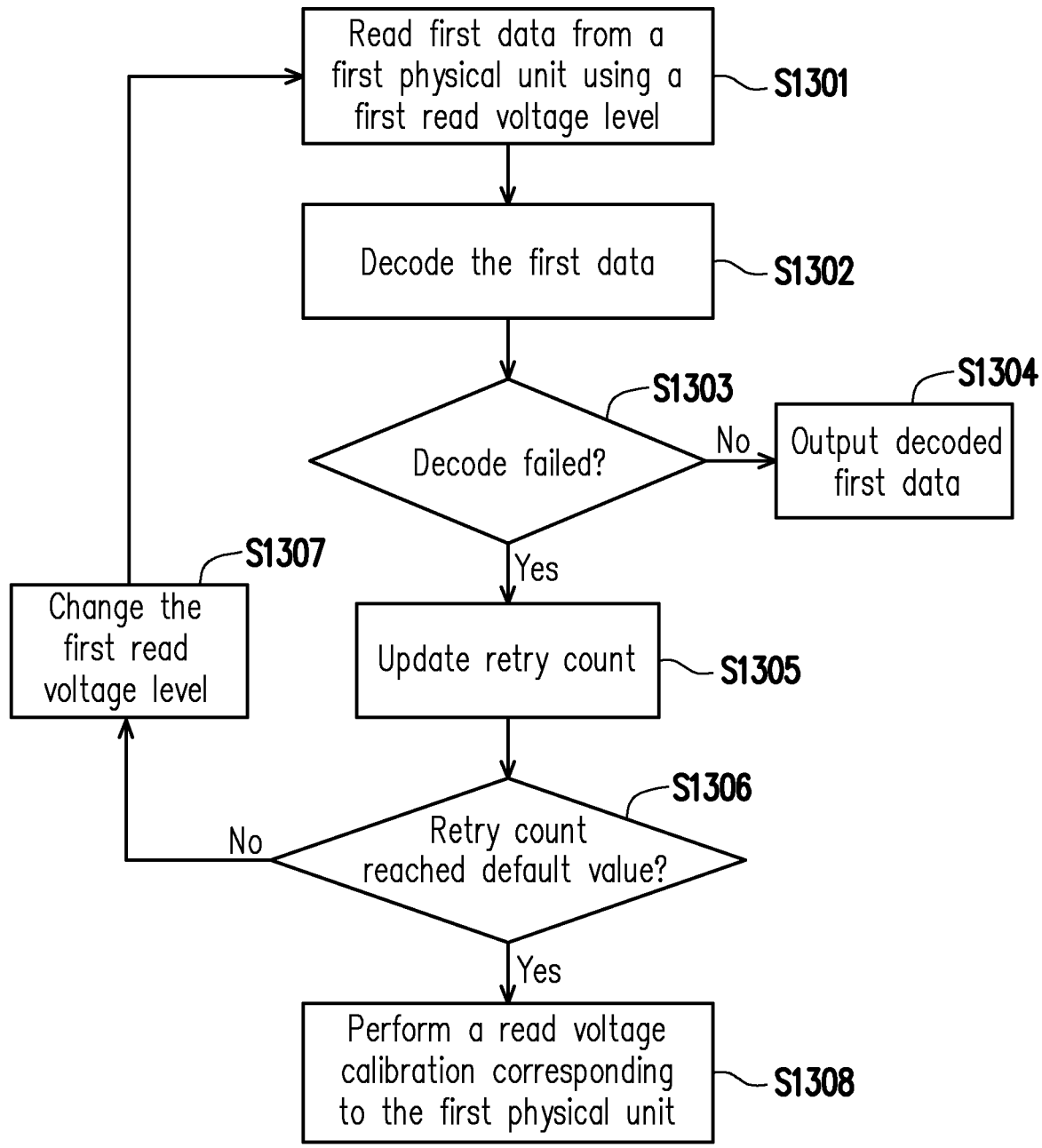
FIG. 13 is a flowchart of a voltage calibration method shown according to an exemplary embodiment of the invention.

FIG. 13 is a flowchart of a voltage calibration method shown according to an exemplary embodiment of the invention.

Please refer to FIG. 13, in step S1301, first data is read from a first physical unit using a first read voltage level. In step S1302, the first data is decoded. In step S1303, whether the decoding of the first data fails is determined. If the decoding of the first data does not fail (that is, the decoding is successful), in step S1304, the decoded first data is output. If the decoding of the first data fails, in step S1305, a retry count is updated. In step S1306, whether the retry count reaches a default value is determined. If the retry count does not reach the default value, in step S1307, the first read voltage level is changed, and step S1301 is repeated. In addition, if the retry count reaches the default value, in step S1308, the read voltage calibration corresponding to the first physical unit is initiated and performed.

However, each step in FIG. 12 and FIG. 13 is as described in detail above, and is not repeated herein. It should be mentioned that, each step in FIG. 12 and FIG. 13 may be implemented as a plurality of program codes or circuits, and the present application is not limited thereto. Moreover, the method of FIG. 12 and FIG. 13 may be used with the above exemplary embodiments, and may also be used alone, and the present application is not limited thereto.

Based on the above, in the voltage calibration method, the memory storage device, and the memory control circuit unit provided by the exemplary embodiments of the invention, the second data read from the additional physical unit (i.e., second physical unit) may be used in the calibration operation for the first read voltage level. In this way, the influence of programming error (or randomization error) of a single physical unit overall may be reduced, thereby improving the calibration efficiency for the first read voltage level.

Although the present application has been disclosed by the above embodiments, they are not intended to limit the present application. It is apparent to one of ordinary skill in the art that modifications and variations to the present application may be made without departing from the spirit and scope of the present application. Accordingly, the protection scope of the present application will be defined by the appended claims.

What is claimed is:

1. A voltage calibration method, configured for a rewritable non-volatile memory module, wherein the rewritable non-volatile memory module comprises a plurality of physical units, and the voltage calibration method comprises:
   reading first data from a first physical unit in the plurality of physical units using a first read voltage level and reading second data from at least one second physical unit in the plurality of physical units using a second read voltage level;
   obtaining count information according to the first data and the second data, wherein the count information reflects a total number of memory cells meeting a default condition in the first physical unit and the at least one second physical unit; and
   calibrating the first read voltage level according to the count information.

2. The voltage calibration method of claim 1, wherein the step of obtaining the count information according to the first data and the second data comprises:
   determining the count information according to first count information and second count information,
   wherein the first count information reflects a total number of first memory cells in the first physical unit, the second count information reflects a total number of second memory cells in the at least one second physical unit, a numerical relationship between a threshold voltage of the first memory cell and the first read voltage level meets a first condition, and a numerical relationship between a threshold voltage of the second memory cell and the second read voltage level meets a second condition.

3. The voltage calibration method of claim 1, wherein the step of calibrating the first read voltage level according to the count information comprises:
   determining an adjustment value according to the count information; and
   calibrating the first read voltage level according to the adjustment value.

4. The voltage calibration method of claim 1, wherein the first physical unit and the at least one second physical unit are operated in a same programming environment.

5. The voltage calibration method of claim 4, wherein the first physical unit and the at least one second physical unit are operated in a same programming environment refers to at least one of the first physical unit and the at least one second physical unit belong to a same type of physical programming unit, time points at which the first physical unit and the at least one second physical unit are programmed are at least partially overlapped, and the time points at which the first physical unit and the at least one second physical unit are programmed are adjacent to each other.

6. The voltage calibration method of claim 1, wherein the rewritable non-volatile memory module comprises a plurality of planes, the first physical unit is located at a first plane of the plurality of planes, and the at least one second physical unit is located at at least one second plane in the plurality of planes.

7. The voltage calibration method of claim 6, wherein the step of reading the first data from the first physical unit in the plurality of physical units using the first read voltage level and reading the second data from the at least one second physical unit in the plurality of physical units using the second read voltage level comprises:
   performing a programming operation on a physical management unit to program the physical management unit, wherein the physical management unit comprises the first physical unit and the at least one second physical unit, and the physical management unit is disposed across the first plane and the at least one second plane; and
   performing a read operation on the physical management unit after the physical management unit is programmed to read the first data from the first physical unit using the first read voltage level and read the second data from the at least one second physical unit using the second read voltage level.

8. The voltage calibration method of claim 1, wherein the read operation configured to read the first data and the second data from the first physical unit and the at least one second physical unit respectively comprises one of a multi-plane read operation and a single-page read operation.

9. The voltage calibration method of claim 1, wherein in the read operation configured to read the first data and the second data from the first physical unit and the at least one second physical unit respectively, read time points of the first physical unit and the at least one second physical unit are at least partially overlapped or adjacent to each other.

10. The voltage calibration method of claim 1, further comprising:
performing a hard decoding operation on the first data after the first data is obtained,
wherein the step of obtaining the count information according to the first data and the second data is performed after the hard decoding operation for the first data is determined as failed.

11. The voltage calibration method of claim 10, wherein the second data is not used in the hard decoding operation of the first data.

12. A memory storage device, comprising:
a connection interface unit configured to be coupled to a host system;
a rewritable non-volatile memory module, wherein the rewritable non-volatile memory module comprises a plurality of physical units; and
a memory control circuit unit coupled to the connection interface unit and the rewritable non-volatile memory module,
wherein the memory control circuit unit is configured to:
issue at least one read command sequence, wherein the at least one read command sequence is configured to read first data from a first physical unit in the plurality of physical units using a first read voltage level and read second data from at least one second physical unit in the plurality of physical units using a second read voltage level;
obtain count information according to the first data and the second data, wherein the count information reflects a total number of memory cells meeting a default condition in the first physical unit and the at least one second physical unit; and
calibrate the first read voltage level according to the count information.

13. The memory storage device of claim 12, wherein the operation of the memory control circuit unit obtaining the count information according to the first data and the second data comprises:
determining the count information according to first count information and second count information,
wherein the first count information reflects a total number of first memory cells in the first physical unit, the second count information reflects a total number of second memory cells in the at least one second physical unit, a numerical relationship between a threshold voltage of the first memory cell and the first read voltage level meets a first condition, and a numerical relationship between a threshold voltage of the second memory cell and the second read voltage level meets a second condition.

14. The memory storage device of claim 12, wherein the operation of the memory control circuit unit calibrating the first read voltage level according to the count information comprises:
determining an adjustment value according to the count information; and
calibrating the first read voltage level according to the adjustment value.

15. The memory storage device of claim 12, wherein the first physical unit and the at least one second physical unit are operated in a same programming environment.

16. The memory storage device of claim 15, wherein the first physical unit and the at least one second physical unit are operated in a same programming environment refers to at least one of the first physical unit and the at least one second physical unit belong to a same type of physical programming unit, time points at which the first physical unit and the at least one second physical unit are programmed are at least partially overlapped, and the time points at which the first physical unit and the at least one second physical unit are programmed are adjacent to each other.

17. The memory storage device of claim 12, wherein the rewritable non-volatile memory module comprises a plurality of planes, the first physical unit is located at a first plane of the plurality of planes, and the at least one second physical unit is located at at least one second plane in the plurality of planes.

18. The memory storage device of claim 17, wherein the operation of the memory control circuit unit issuing the at least one read command sequence comprises:
issuing at least one write command sequence, wherein the at least one write command sequence is configured to instruct to perform a programming operation on a physical management unit to program the physical management unit, wherein the physical management unit comprises the first physical unit and the at least one second physical unit, and the physical management unit is disposed across the first plane and the at least one second plane; and
issuing the at least one read command sequence after the physical management unit is programmed, wherein the at least one read command sequence is configured to instruct to perform a read operation on the physical management unit to read the first data from the first physical unit using the first read voltage level and read the second data from the at least one second physical unit using the second read voltage level.

19. The memory storage device of claim 12, wherein the read operation configured to read the first data and the second data from the first physical unit and the at least one second physical unit respectively comprises one of a multi-plane read operation and a single-page read operation.

20. The memory storage device of claim 12, wherein in the read operation configured to read the first data and the second data from the first physical unit and the at least one second physical unit respectively, read time points of the first physical unit and the at least one second physical unit are at least partially overlapped or adjacent to each other.

21. The memory storage device of claim 12, wherein the memory control circuit unit is further configured to:
perform a hard decoding operation on the first data after the first data is obtained,
wherein the operation of obtaining the count information according to the first data and the second data is performed after the hard decoding operation for the first data is determined as failed.

22. The memory storage device of claim 21, wherein the second data is not used in the hard decoding operation for the first data.

23. A memory control circuit unit, configured to control a rewritable non-volatile memory module, wherein the rewritable non-volatile memory module comprises a plurality of physical units, and the memory control circuit unit comprises:

a host interface configured to be coupled to a host system;
a memory interface configured to be coupled to the rewritable non-volatile memory module; and
a memory management circuit coupled to the memory interface,
wherein the memory management circuit is configured to:
issue at least one read command sequence, wherein the at least one read command sequence is configured to read first data from a first physical unit in the plurality of physical units using a first read voltage level and read second data from at least one second physical unit in the plurality of physical units using a second read voltage level;
obtain count information according to the first data and the second data, wherein the count information reflects a total number of memory cells meeting a default condition in the first physical unit and the at least one second physical unit; and
calibrate the first read voltage level according to the count information.

24. The memory control circuit unit of claim 23, wherein the operation of the memory management circuit obtaining the count information according to the first data and the second data comprises:
determining the count information according to first count information and second count information,
wherein the first count information reflects a total number of first memory cells in the first physical unit, the second count information reflects a total number of second memory cells in the at least one second physical unit, a numerical relationship between a threshold voltage of the first memory cell and the first read voltage level meets a first condition, and a numerical relationship between a threshold voltage of the second memory cell and the second read voltage level meets a second condition.

25. The memory control circuit unit of claim 23, wherein the operation of the memory management circuit calibrating the first read voltage level according to the count information comprises:
determining an adjustment value according to the count information; and
calibrating the first read voltage level according to the adjustment value.

26. The memory control circuit unit of claim 23, wherein the first physical unit and the at least one second physical unit are operated in a same programming environment.

27. The memory control circuit unit of claim 26, wherein the first physical unit and the at least one second physical unit are operated in a same programming environment refers to at least one of the first physical unit and the at least one second physical unit belong to a same type of physical programming unit, time points at which the first physical unit and the at least one second physical unit are programmed are at least partially overlapped, and the time points at which the first physical unit and the at least one second physical unit are programmed are adjacent to each other.

28. The memory control circuit unit of claim 23, wherein the rewritable non-volatile memory module comprises a plurality of planes, the first physical unit is located at a first plane of the plurality of planes, and the at least one second physical unit is located at at least one second plane in the plurality of planes.

29. The memory control circuit unit of claim 28, wherein the operation of the memory management circuit issuing the at least one read command sequence comprises:
issuing at least one write command sequence, wherein the at least one write command sequence is configured to instruct to perform a programming operation on a physical management unit to program the physical management unit, wherein the physical management unit comprises the first physical unit and the at least one second physical unit, and the physical management unit is disposed across the first plane and the at least one second plane; and
issuing the at least one read command sequence after the physical management unit is programmed, wherein the at least one read command sequence is configured to instruct to perform a read operation on the physical management unit to read the first data from the first physical unit using the first read voltage level and read the second data from the at least one second physical unit using the second read voltage level.

30. The memory control circuit unit of claim 23, wherein the read operation configured to read the first data and the second data from the first physical unit and the at least one second physical unit respectively comprises one of a multi-plane read operation and a single-page read operation.

31. The memory control circuit unit of claim 23, wherein in the read operation configured to read the first data and the second data from the first physical unit and the at least one second physical unit respectively, read time points of the first physical unit and the at least one second physical unit are at least partially overlapped or adjacent to each other.

32. The memory control circuit unit of claim 23, wherein the memory control circuit unit further comprises an error detection and correction circuit, the error detection and correction circuit is coupled to the memory management circuit, and the memory management circuit is further configured to:
instruct the error detection and correction circuit to perform a hard decoding operation on the first data after the first data is obtained,
wherein the operation of obtaining the count information according to the first data and the second data is performed after the hard decoding operation for the first data is determined as failed.

33. The memory control circuit unit of claim 32, wherein the second data is not used in the hard decoding operation of the first data.

* * * * *